(12) United States Patent
Rebstock

(10) Patent No.: US 10,727,098 B2
(45) Date of Patent: Jul. 28, 2020

(54) RETICLE COMPARTMENT AND DIFFUSOR PLATE

(71) Applicant: Brooks Automation GmbH, Jena (DE)

(72) Inventor: Lutz Rebstock, Radolfzell (DE)

(73) Assignee: Brooks Automation (Germany) GmbH (DE)

( * ) Notice: Subject to any disclaimer, the term of this patent is extended or adjusted under 35 U.S.C. 154(b) by 0 days.

(21) Appl. No.: 16/328,848

(22) PCT Filed: Aug. 29, 2017

(86) PCT No.: PCT/EP2017/071631
§ 371 (c)(1),
(2) Date: Feb. 27, 2019

(87) PCT Pub. No.: WO2018/041816
PCT Pub. Date: Mar. 8, 2018

(65) Prior Publication Data
US 2019/0189483 A1      Jun. 20, 2019

(30) Foreign Application Priority Data
Aug. 30, 2016   (EP) ..................................... 16186441

(51) Int. Cl.
*H01L 21/673* (2006.01)

(52) U.S. Cl.
CPC .. *H01L 21/67393* (2013.01); *H01L 21/67359* (2013.01); *H01L 21/67376* (2013.01); *H01L 21/67386* (2013.01)

(58) Field of Classification Search
CPC .................... H01L 21/67359; H01L 21/67393
See application file for complete search history.

(56) References Cited

U.S. PATENT DOCUMENTS

| 6,044,874 A | 4/2000 | Saga |
| 8,403,143 B2 | 3/2013 | Chiu et al. |
| 2005/0056441 A1* | 3/2005 | Rider ................ H01L 21/67353 174/387 |
| 2006/0266011 A1 | 11/2006 | Halbmaier et al. |

FOREIGN PATENT DOCUMENTS

| JP | 2002170876 | 6/2002 |
| KR | 101637498 | 7/2016 |

OTHER PUBLICATIONS

International Search Report for PCT/EP2017/071631 dated Dec. 15, 2017.

* cited by examiner

*Primary Examiner* — Michelle M Iacoletti
(74) *Attorney, Agent, or Firm* — Perman & Green, LLP

(57) ABSTRACT

A reticle compartment defining an enclosed interior adapted to store at least two reticles in a reticle storage portion, including an inlet port, through which a purge gas can enter the enclosed interior, and an outlet port, through which the purge gas can exit the enclosed interior, wherein the reticle compartment further includes a first diffusor plate arranged in the enclosed interior between the inlet port and the reticle storage portion, wherein the first diffusor plate is provided with openings, through which the purge gas can flow, the openings in a central section of the first diffusor plate being provided with a larger individual opening area and/or providing a larger total opening area per unit area than openings in a peripheral section of the first diffusor plate.

12 Claims, 7 Drawing Sheets

RETICLE COMPARTMENT AND DIFFUSOR PLATE

CROSS-REFERENCE TO RELATED APPLICATIONS

This application is the National Stage of International Application No. PCT/EP2017/071631, having an International Filing Date of 29 Aug. 2017, which designated the United States of America, and which International Application was published under PCT Article 21(2) as WO Publication No. 2018/041816 A1, and which claims priority from, and the benefit of, European Application No. 16186441.8, filed 30 Aug. 2016, the disclosures of which are incorporated herein by reference in their entireties.

BACKGROUND

1. Field

The present disclosure relates to a reticle compartment and a diffusor plate adapted to be used in an interior of a reticle compartment.

2. Brief Description of Related Developments

In semiconductor technology, reticles or photomasks are used for the mass production of integrated circuit devices. A reticle is an opaque plate with holes or transparencies that allow light to shine through in a defined pattern.

It is well known that any type of contamination, for example dust particles or organic materials adhering to a reticle can cause degradation of the quality of a projected pattern. It is thus of utmost importance to store and handle reticles in an absolutely clean environment.

It is known to store reticles in so called compartment stockers, which can store up to a few thousand individual reticles. Reticles within such stockers are, for example, stored in designated reticle compartments, which are designed to hold a number of reticles, for example 1, 2, 4, 6, 8 or 10.

From U.S. Pat. No. 8,403,143 B2 a reticle storing compartment is known. This compartment is designed for the storage of one reticle. In order to reduce the number of potentially contaminating particles within the compartment, two methods are disclosed in this document, i.e. filling the reticle compartment with a clean gas by means of a purging head, and, alternatively, exhausting the gas in the compartment by means of a vacuum pump.

Purging advantageously comprises a constant flow of clean gas through the compartment, the gas entering by an inlet port, and exiting by an outlet port of the compartment. Typical purging gases are, for example, extremely clean dry air and nitrogen. Providing such gases is a cost factor, so that a reduction of the amount of gas flowing through a reticle compartment, which is at the same time sufficient for an effective purge, would be advantageous.

This aspect becomes even more significant in case of reticle compartments adapted to store a multitude of reticles. In case of prior art purge gas inlet and outlet, pronounced turbulences of purge gas flowing through the compartment occur, leading to the necessity of a higher throughput of purge gas.

SUMMARY

The present disclosure attempts to provide a reticle compartment adapted for purge cleaning of reticles stored therein, for which the throughput of purge gas is minimized.

This aim is achieved with a reticle compartment comprising the features of claim 1 and a diffusor plate comprising the features of claim 12. Advantageous aspects of the reticle compartment according to the present disclosure are the subject matter of the dependent claims.

The reticle compartment according to the present disclosure ensures a more uniform and less turbulent flow of purge gas through its enclosed interior, in which the multitude of reticles are stored. This is especially achieved by the design of the diffusor plate arranged between the inlet port and the portion of the reticle interior where the reticles are stored. Providing the diffusor plate with openings with larger individual opening areas in its central section as compared to a peripheral section, and/or such that the openings in the central section provide a larger total opening area per unit area than openings in the peripheral area establishes a substantially more uniform flow compared to prior art diffusor plates designed for example with a uniform opening size over the whole diffusor plate area. This diffusor plate design according to the present disclosure also significantly reduces turbulences within the compartment.

Advantageously, the opening areas of individual openings become progressively smaller from the central section to at least one peripheral section of the diffuser plate. Alternatively or in addition hereto, the total opening area per unit area can become progressively smaller from the central section to least one peripheral section of the diffuser plate by means of decreasing the number of openings per unit area. For example, in the central section, there can be provided 4 openings per suitably defined unit area, and in a peripheral section there can be provided 3, 2, or 1 opening(s) per unit area. The decrease of individual opening area and total opening area per unit area from the central section to a peripheral section can be combined. For example, in the central area there can be provided 4 openings per unit area with a first individual opening area, and in a peripheral section there can be provided 3, 2, or 1 opening(s) per unit area with a second individual opening area, the second individual opening area being smaller than the first individual opening area.

According to an advantageous embodiment of the reticle compartment, there is provided a second diffusor plate arranged between the reticle storage portion and the outlet port of the reticle compartment. Providing such a second diffusor plate on the outlet side of the reticle compartment further enhances the uniformity of flow and reduces turbulences. Advantageously, both diffusor plates extend parallel.

Advantageously, the second diffusor plate is designed essentially like the first diffusor plate, i.e. comprising openings in a central section provided with a larger individual opening area than openings in peripheral sections. Also, the number of openings per unit area can be modified, as described above. By designing both diffusor plates in the same manner, especially with the positions and opening areas or sizes of the respective openings aligned to one another, uniformity of flow of a purge gas can be further enhanced, as well as turbulences reduced. Alternatively, it is possible to provide the second diffusor plate with a different design compared to the first diffusor plate. For example, the second diffusor plate can comprise a different arrangement of individual openings and/or individual openings comprising different individual opening areas and/or different total opening areas per unit area in at least one section as compared to the first diffusor plate.

Advantageously, the reticle storage portion is provided to store the reticles such that each reticle extends essentially perpendicularly to the first diffusor plate and/or the second diffusor plate. This orthogonal arrangement of stored reticles relative to the diffusor plate(s) ensures the uniform and smooth flow of purge gas along each of the stored reticles, the uniform flow especially ensuring that minimal amounts of purge gas are sufficient to guarantee an optimal purging effect.

According to a preferred aspect of the present disclosure, the reticle compartment is made, at least in part, of at least one metal material. By this choice of material the release of gases (outgassing) that are dissolved, trapped or absorbed in the material of the reticle compartment can be minimized. In prior art reticle compartments, the main materials used for manufacture were plastic materials, in which outgassing effects are significantly more pronounced. Preferred metal materials are aluminium and/or stainless steel. Advantageously, a body member and a lid of a reticle compartment can be made of aluminium, whereas diffusor plates are made of stainless steel.

Expediently, the reticle compartment according to the present disclosure comprises retainer elements, especially slots or ridges, on or between which reticles can be positioned. By providing an expedient amount of such retainer elements, reticle compartments can be specifically adapted to store a desired number of reticles.

Advantageously, the retainer elements are provided with inserts and/or linings made of a polymer material such as, for example, a thermoplastic material or a composite thereof. As such inserts and/or linings have a smaller volume and/or surface area compared to the reticle compartment as a whole, outgassing effects due to such inserts and/or linings are reduced. Suitable polymer materials include, but are not limited to, polybenzimidazole (PBI), polyimide (PI), polyamide-imide (PAI), polytetrafluoroethylene (PTFE), polychlorotetrafluoroethylene (PCTFE), polyetheretherketone (PEEK), polyethylene terephthalate (PET-P), polycarbonate (PC), acetal, and composites (e.g., glass and/or carbon fiber composites) and combinations thereof. In some aspects, the polymer material is chosen to have relatively low outgassing effects as compared to other polymer materials.

The reticle compartment according to the present disclosure is advantageously adapted to efficiently store a multitude of reticles in a clean environment, wherein especially 2, 3, 4, 5, 6, 7, 8, 9, 10 or more reticles can be stored.

According to a preferred aspect, the openings of the first diffusor plate and/or the openings of the second diffusor plate are provided with at least two, especially 2, 3, 4, 5 or 6 different individual opening areas, the opening areas decreasing from a largest individual opening area in a central section of the first and/or second diffusor plates to a smallest individual opening area in the vicinity of the peripheral section or edges of the first and/or second diffusor plates. This especially means that the openings in the peripheral section or edge sections of the first and/or second diffusor plates, i.e. the most peripheral sections, are provided with the smallest opening areas, the opening areas of the openings increasing towards the central sections of the first and/or second diffusor plates. For example, the openings in a central section can be provided with first opening areas, for example each greater than about 15 mm2 and openings in the vicinity of the edges, i.e. in the peripheral section, of the first and/or second diffusor plates with second opening areas each less than about 15 mm2. In some aspects, openings in an intermediate section, i.e. between the central section and the peripheral section of the first and/or second diffusor plates, can be provided with third opening areas which are intermediate the areas of the first and second opening areas. For example, in some aspects the first opening areas are each about 19 to 22 mm2, the second opening areas are each about 11 to 14 mm2, and the third opening areas are each about 15 to about 18 mm2. In some aspects, the total opening area of a central section is greater than about 450 mm2 and the total opening area of a peripheral section is less than about 450 mm2. For example, the total opening area of a central section can be about 500 to 600 mm2, the total opening area of an intermediate area can be about 400 to 500 mm2, and the total opening areas of a peripheral section can be about 300 to 400 mm2.

According to a preferred aspect, all of the outermost peripheral openings of the first and/or second diffusor plates are smaller in their individual opening area than openings in the central section.

Expediently, the individual openings comprise opening areas which are round and/or oval and/or square and/or triangular and/or oblong and/or egg shaped and/or crescent shaped and/or slit shaped and/or polygon shaped.

BRIEF DESCRIPTION OF THE DRAWINGS

Preferred aspects of the present disclosure will now be further described with reference to the appended figures.

DETAILED DESCRIPTION

Figure 1:
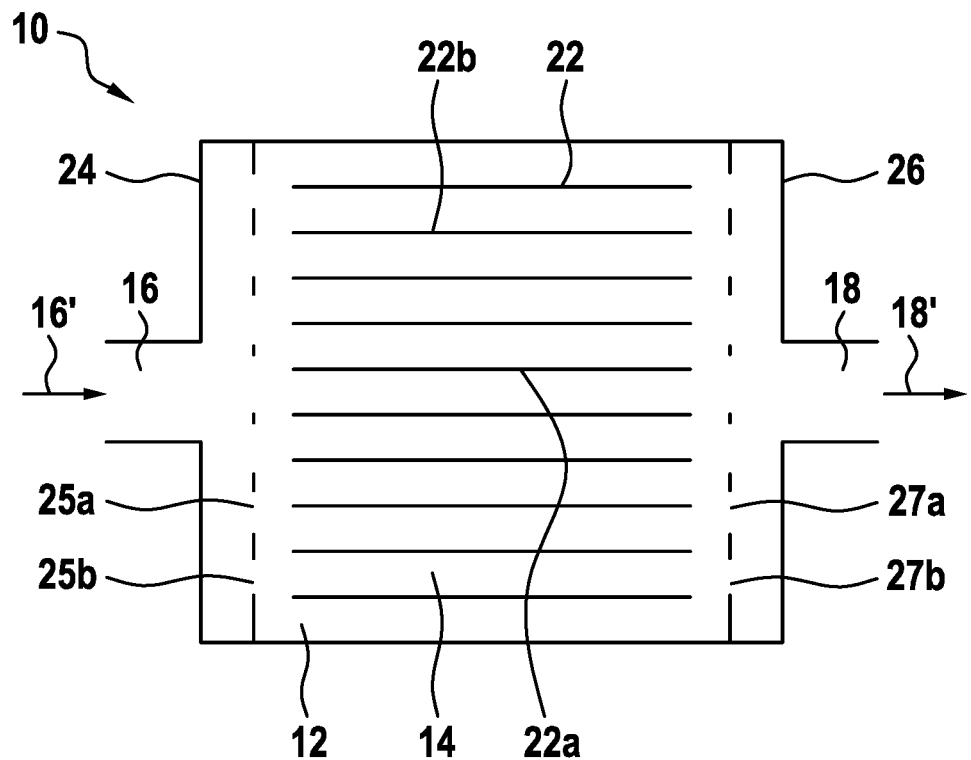
FIG. 1 shows a schematically simplified side sectional view of a first aspect of a reticle compartment according to the present disclosure.

FIG. 1 shows, in schematic simplification, a preferred aspect of a reticle compartment according to the present disclosure, generally designated 10.

It defines a closed interior 12, comprising a reticle storage portion 14, in which a multitude of reticles 22 can be stored. The actual interaction between the reticles and the compartment is not shown in FIG. 1. Especially, no retainer elements for holding individual reticles are shown.

The reticle compartment comprises an inlet port 16, through which a purge gas (indicated by arrow 16') can enter the enclosed interior 12 of the reticle compartment. It further comprises an outlet port 18, through which purge gas can exit the enclosed interior 12, indicated by means of arrow 18'.

Figure 2:
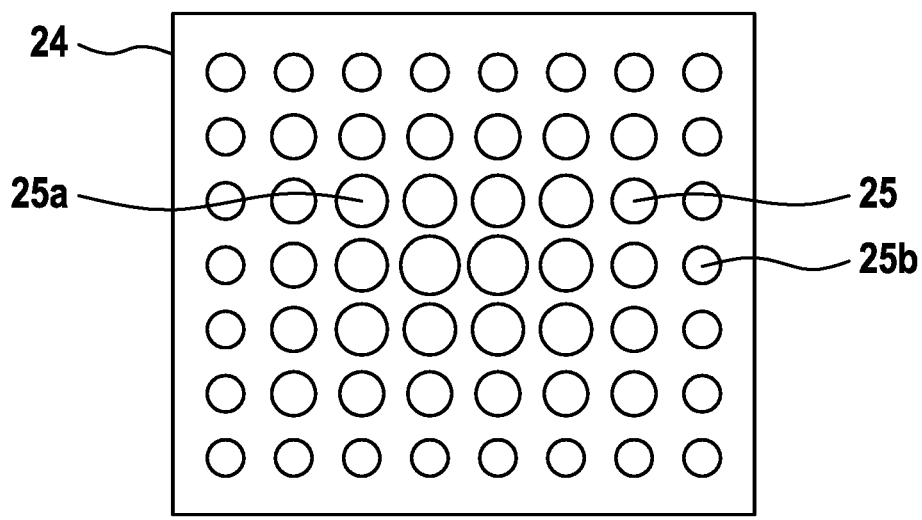
FIG. 2 shows a plan view of a preferred aspect of a diffusor plate according to the present disclosure.

To ensure a uniform and essentially turbulence-free flow of purge gas through the whole volume of the reticle storage portion 14, a first diffusor plate 12 is arranged between inlet port 16 and reticle storage portion 14. The first diffusor plate 24 comprises a multitude of openings 25, through which purge gas can enter the reticle storage portion 14. As schematically indicated in FIG. 1, and especially can be seen in FIG. 2, the openings 25a in a central section of first diffusor plate 24 are larger, i.e. are provided with a larger opening area or a larger diameter than openings 25b in peripheral sections.

Between reticle storage portion 14 and outlet port 18, there is provided a second diffusor plate 26, which is also provided with openings 27a and 27b. Advantageously, the pattern of openings 27a and 27b corresponds to that of first diffusor plate 24, i.e. openings 27a in the central section have a larger opening area than openings 27b in peripheral sections.

As can further be seen in FIG. 1, the reticles 22 stored in reticle storage portion 14 are arranged orthogonally relatively to the first and second diffusor plate 24, 26. This arrangement ensures that purge gas flowing through the reticle compartment from inlet port 16 to outlet port 18 provides a uniform flow, so that all reticles 22 are essentially equally exposed to purge gas and thereby purged in an optimal manner. This uniform flow is especially enhanced by the pattern of openings 25a, 25b, 27a, 27b which ensures that the flow of purge gas along more peripherally arranged reticles (for example reticle 22b as indicated in FIG. 1) essentially corresponds to that along a more central reticle (for example reticle 22a as indicated in FIG. 1).

Figure 3:
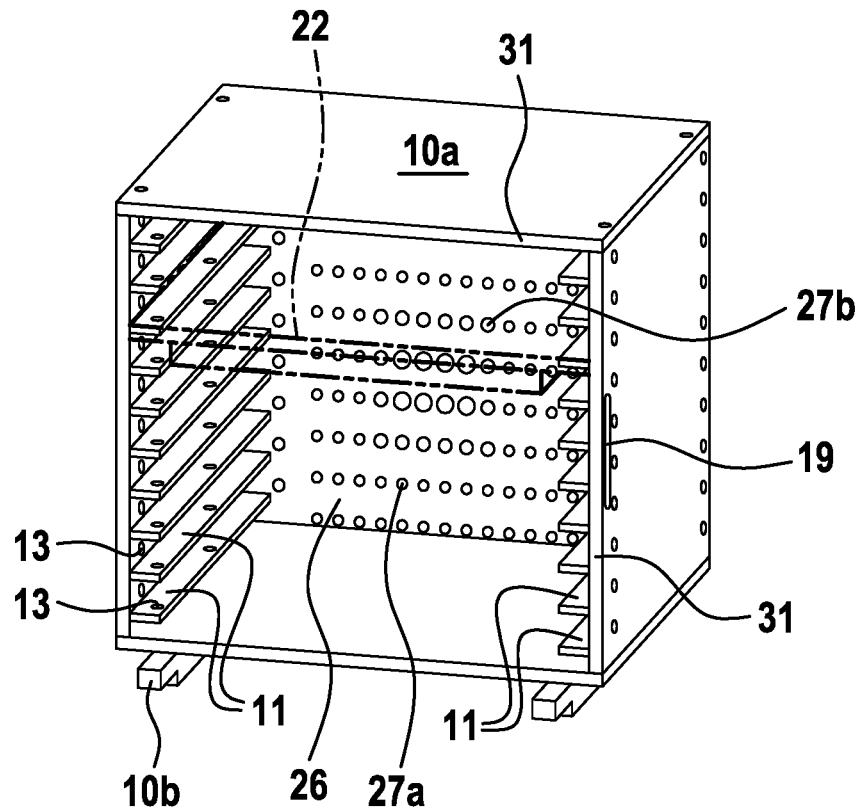
FIG. 3 shows a perspective view of a preferred aspect of body member of a reticle compartment according to the present disclosure.
Figure 4:
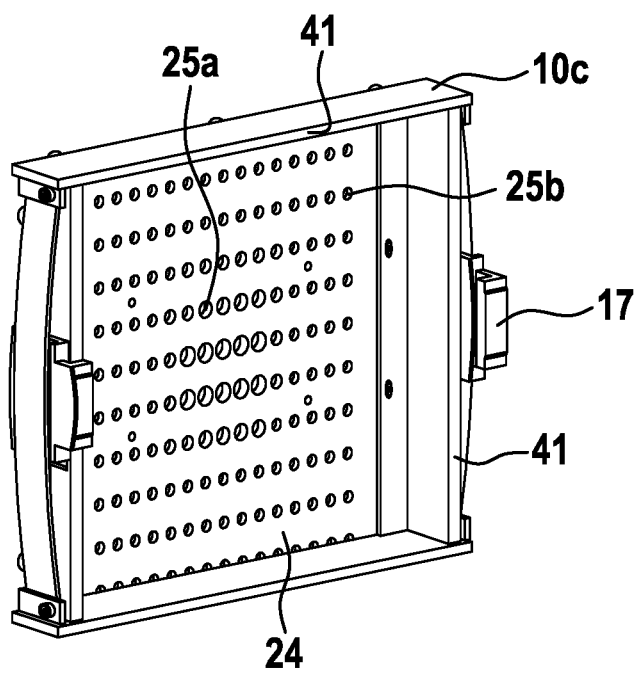
FIG. 4 shows a preferred aspect of a lid of a reticle compartment according the present disclosure, which, together with the body according to FIG. 3, forms a reticle compartment.

Typically, a reticle compartment comprises a body member provided with retainer elements for holding individual reticles and a lid adapted to close the volume defined by the body member. Preferred aspects of such a body member and a lid are shown in FIGS. 3 and 4 respectively. Be it noted that identical or similar components as already described with reference to FIGS. 1 and 2 have the same reference numerals in FIGS. 3 and 4.

FIG. 3 shows a body member 10a. Body member 10a comprises a plurality of retainer elements 11 on opposing inner walls of body member 10a. The retainer elements are adapted to hold individual reticles. To illustrate this, one reticle 22 is shown in FIG. 3, which, with two opposite sides, rests on corresponding retainer elements 11. As can be immediately seen, the retainer elements 11 are adapted for horizontal storage of reticles 22. The retainer elements 11 according to the embodiment of FIG. 3 are provided as ridges.

The body element 10a is manufactured of a metal material, for example aluminium or stainless steel.

In order to avoid electrostatic effects between the body member 10a or the reticle compartment and reticles 22 stored therein, each retainer element 11 is provided with inserts 13 made of a polymer material. Thus, a reticle stored within the reticle compartment 10 on retainer elements 11 will not contact these retainer elements directly, but will be insulated from them by means of inserts 13. Inserts 13 can also be provided on the inside walls of body member 10a. This electric insulation further reduces the tendency of reticles to attract contamination such as dust particles within the reticle compartment. Inserts 13 also serve to prevent scratching of reticles.

As can be seen in FIG. 3, the rear side of body member 10a is provided with a diffusor plate 26 and an outlet port (not visible in FIG. 3), analogously to the aspect of FIG. 1. The openings 27aa in the central section of diffusor plate 26 are provided with larger opening areas than openings 27b in peripheral sections.

For ease of handling within a compartment stocker, the body member 10a is provided with feet 10b.

A lid 10c as shown in FIG. 4 is adapted to interact with body member 10a, i.e. to tightly close the volume defined by body member 10a to provide an enclosed interior of reticle compartment 10.

Lid 10c is provided with a locking mechanism 17, adapted to interact with grooves 19 provided in the outside walls of body member 10a (see FIG. 3). The inside edges 41 of the lid and/or the edges 31 at the opening of body member 10a are provided with seal members, such that by interaction of the lock mechanism 17 with the groves 19 a gas tight connection between lid and body member is achieved.

The lid is provided with a diffusor plate 24. An inlet port 16 also provided on lid 10c is not visible in FIG. 4.

The openings 25a in the central section of diffusor plate 24 are provided with larger opening areas than those openings 25b in peripheral or edge sections, as explained above. Especially, the openings in the vicinity of at least some of the edges of the diffusor plates are provided with the smallest opening areas. In some aspects, only a top and/or bottom edge section of the diffusor plate is provided with the smallest opening areas. In other aspects, all of the edge sections of the diffusor plate are provided with the smallest opening areas.

The lid 10c is manufactured of a metallic material, for example aluminium and/or stainless steel.

The diffusor plates 24, 26 are preferably made of stainless steel. However, aluminium can also be used.

As explained with reference to FIG. 3, the reticle compartment shown is adapted for horizontal storage of reticles.

Advantageously, the reticles are stored orthogonally in relation to the diffusor plates. A vertical storage within a reticle compartment would also be possible. In this case, the retainer elements are advantageously provided as grooves, to ensure safe positioning and handling.

The reticle container 10 comprising body element 10a and lid 10c is adapted to store reticles within a reticle stocker. In order to insert or extract a reticle, lid 10c is removed from the body member.

Under normal storage conditions within a reticle stocker, the inlet port 16 is connected to a pressurized purge gas source. After flowing through the reticle compartment in the manner described above, purge gas is exhausted into the reticle stocker, from where it is drawn out of the reticle stocker by a vacuum device.

In FIGS. 5a-5i, further designs for preferred aspects of diffusor plates according to the present disclosure are shown. The diffusor plates shown in FIG. 5 can either be used as first and/or second diffusor plate as specified above. It is also possible to utilize different ones of these diffusor plate designs as first and second diffusor plate respectively. The design according to FIG. 5a comprises essentially square openings 50 in a central sections, and slit-shaped openings 52 in peripheral sections. In this aspect, the square shaped openings 50 provide a larger total opening area per unit area than slit-shaped openings 52. An expediently size unit area is, as an example, designated 80 in FIG. 5a. Such unit areas are not shown in the further aspects of FIGS. 5a-5i.

Figure 5A:
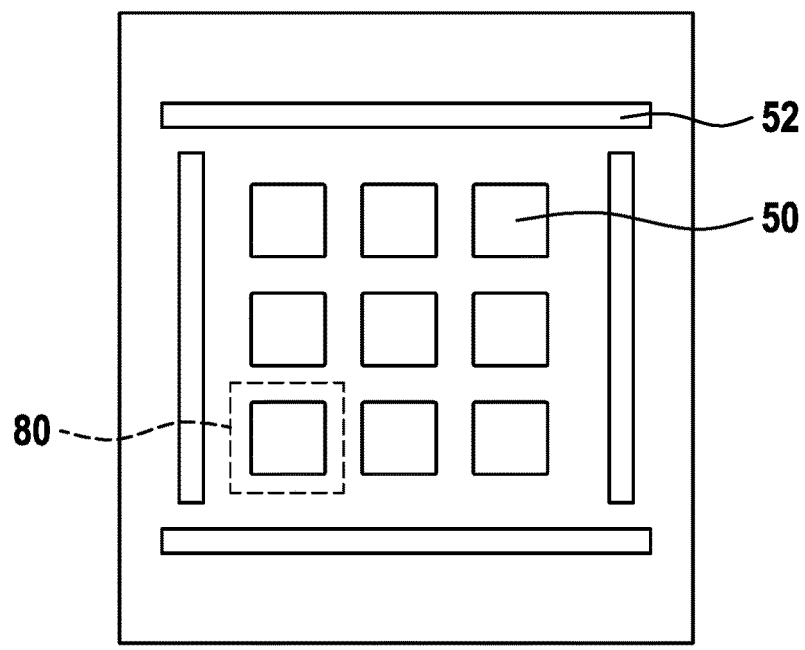
FIGS. 5a-5i show plan views of various further preferred aspects of diffusor plates according to the present disclosure.
Figure 5B:
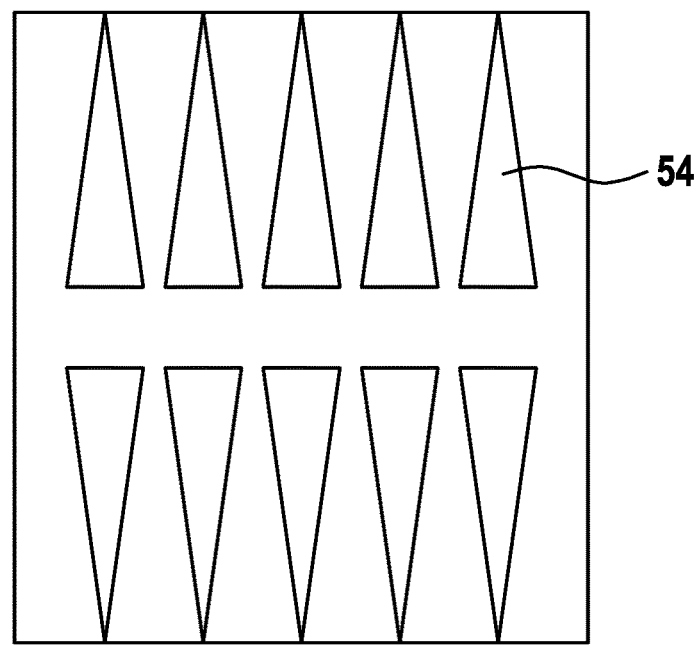

According to the aspect of FIG. 5b, triangular openings 54 are provided. The bases of these triangular openings 54 are located in the central section of the diffusor plate, and the tips towards the upper and lower peripheral sections. Again, comparing the central section to the upper and lower peripheral sections, the total opening area per unit area is larger in the central section.

Figure 5C:
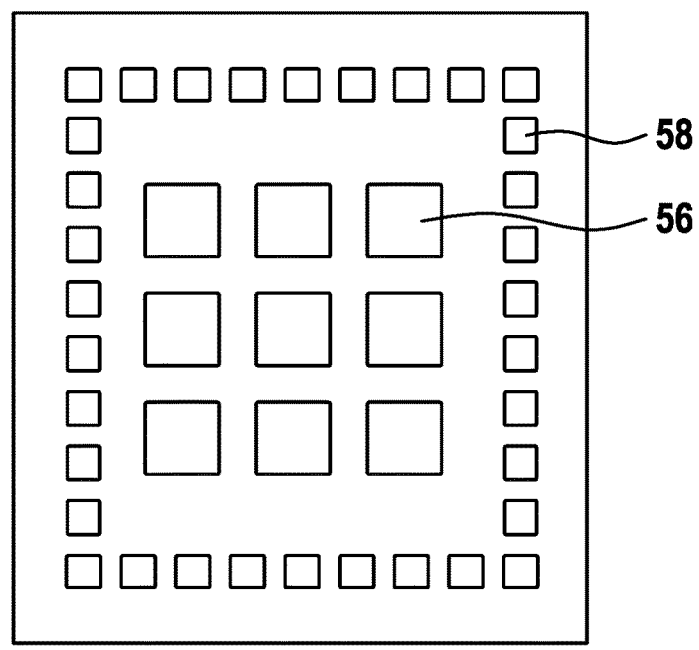

According to the aspect of FIG. 5c, larger square shaped openings 56 are provided in the central section of the diffusor plate, and smaller square shaped openings 58 in the peripheral section. Again, the total opening area per unit area is larger in the central section.

Figure 5D:
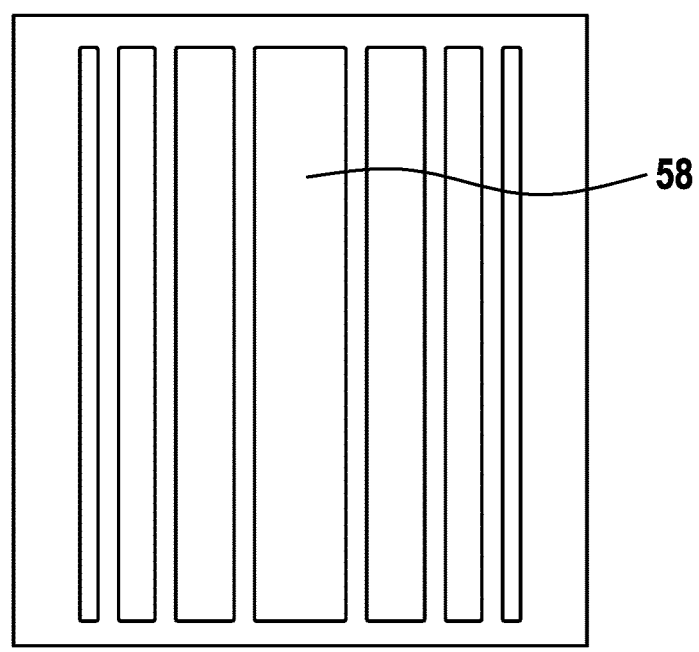

According to the aspect of FIG. 5d, a number of oblong or rectangular openings 58 are provided. The openings in the central section are larger than those in the left and right peripheral sections, the opening areas thus decreasing from the central section to these peripheral sections.

Figure 5E:
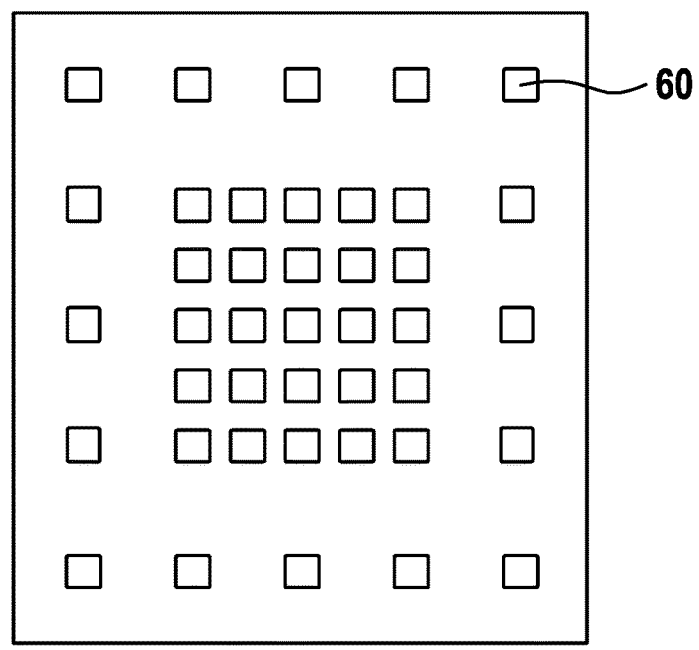

The aspect of the diffusor plate according to FIG. 5e has similarities to the aspect of FIG. 5c. However, here all square shaped openings 60 have the same opening area. However, the density of openings is larger in the central section than in the peripheral section. Thus, the central section has a larger total opening per unit area as compared to the peripheral section.

Figure 5F:
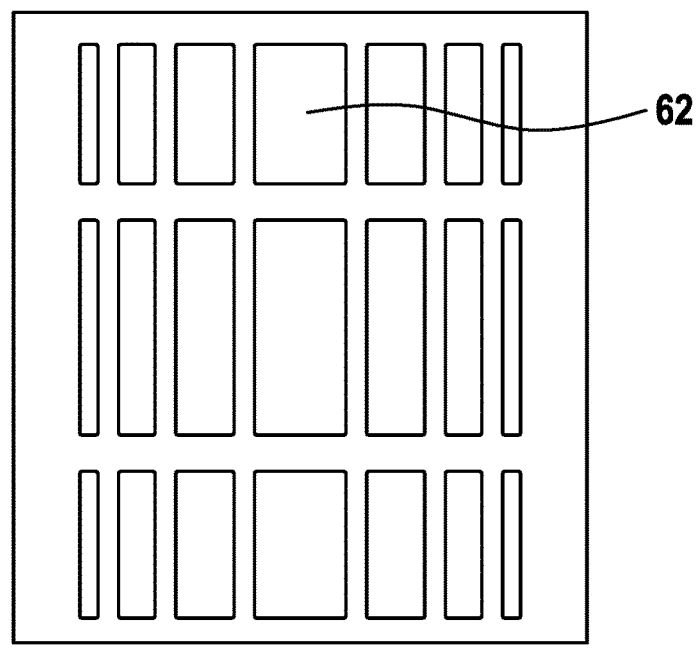

According to the aspect of FIG. 5f, oblong or rectangular shaped openings 62 are provided, the opening area of which decreases towards the left and right peripheral sections of the diffusor plate.

Figure 5G:
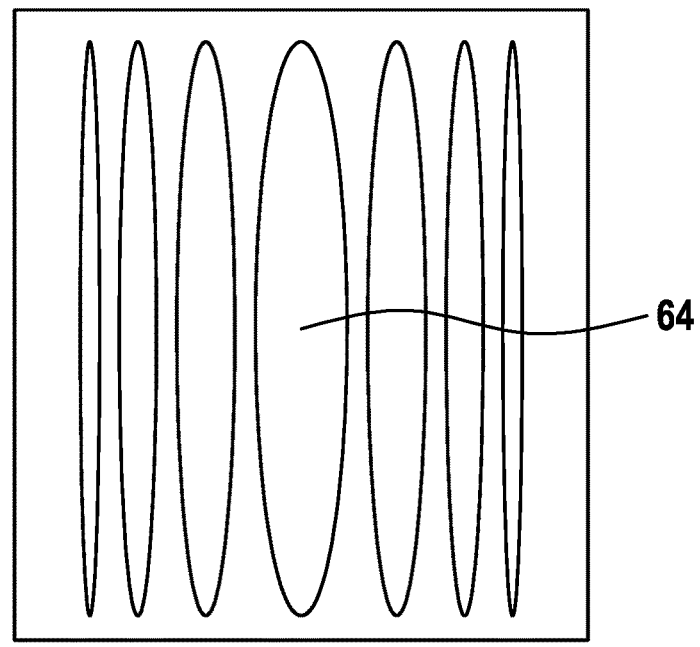

According to the aspect of FIG. 5g, a number of oval shaped openings 64 are provided. The oval shaped opening 64 in the central section have larger opening areas as compared to openings in the left and right peripheral sections.

Figure 5H:
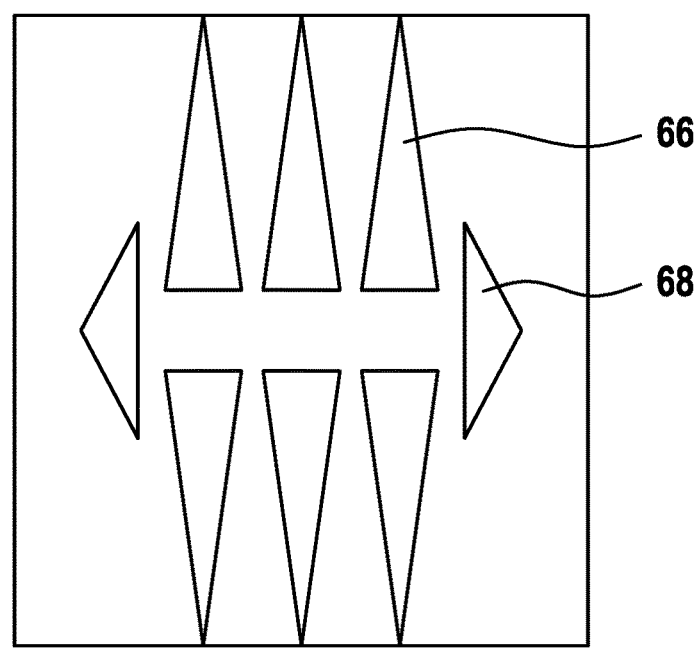

According to the aspect of FIG. 5h, a number of triangular shaped openings 66, 68 are provided. Here again, similarly to FIG. 5b, the bases of the triangular shaped openings are located in the central section, and the tips of the openings in the peripheral sections of the diffusor plate. Thus, the total opening area per unit area is larger in the central section than in the peripheral sections.

Figure 5I:
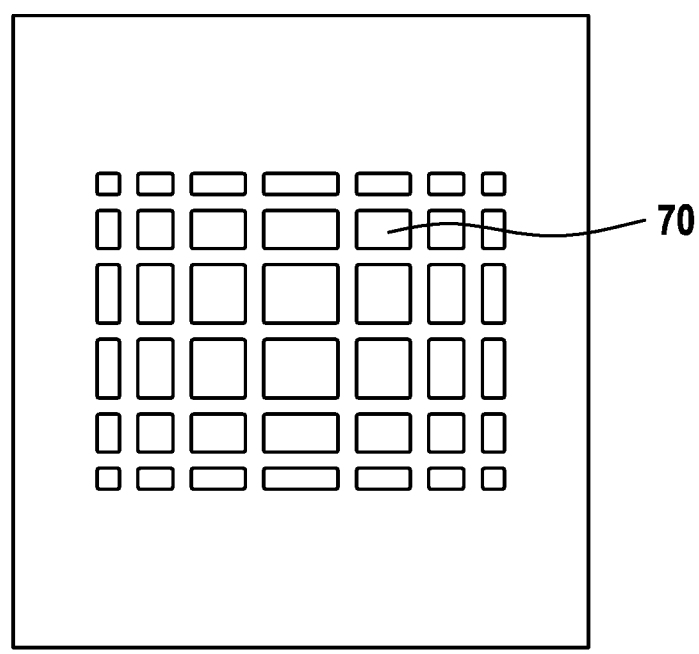

According to the aspect of FIG. 5i, a number of rectangular or oblong openings 70 are provided, the opening area of which decreases from a central section towards the left and right as well as top and bottom peripheral sections.

As will be appreciated, and as partly expanded on above, all these diffusor plate designs are provided with openings with larger individual opening areas and/or providing a larger total opening area per unit area in their central sections as compared to peripheral sections.

What is claimed is:

1. A reticle compartment defining an enclosed interior adapted to store at least two reticles in a reticle storage portion, comprising an inlet port, through which a purge gas can enter the enclosed interior, and an outlet port, through which the purge gas can exit the enclosed interior, wherein the reticle compartment further comprises a first diffusor plate arranged in the enclosed interior between the inlet port and the reticle storage portion, wherein the first diffusor plate is provided with openings, through which the purge gas can flow, the openings in a central section of the first diffusor plate being provided with a larger individual opening area and/or providing a larger total opening area per unit area than openings in a peripheral section of the first diffusor plate, wherein the peripheral section circumscribes the central section.

2. The reticle compartment according to claim 1, wherein there is provided a second diffusor plate arranged between the reticle storage portion and the outlet port.

3. The reticle compartment according to claim 2, wherein the second diffusor plate is provided with openings, through which the purge gas can flow, the openings in a central section of the second diffusor plate being provided with a larger individual opening area and/or providing a larger total opening area per unit area than openings in the peripheral section of the second diffusor plate.

4. The reticle compartment according to claim 3, wherein the openings of the first diffusor plate and/or the openings of the second diffusor plate are provided with at least 2 different individual opening areas, the opening areas decreasing from a largest individual opening area for openings in a central section of the first and/or second diffusor plates, to a smallest opening area in the vicinity of the peripheral section of the first and/or second diffusor plates.

5. The reticle compartment according to claim 2, wherein the reticle storage portion is provided to store the at least two reticles such that each reticle extends essentially perpendicularly to the first diffusor plate and/or the second diffusor plate.

6. The reticle compartment according to claim 1, made at least in part of at least one metal material, the metal material comprising aluminium and/or stainless steel.

7. The reticle compartment according to claim 1, comprising retainer elements on or between which reticles can be positioned.

8. The reticle compartment according to claim 7, wherein the retainer elements are provided with inserts and/or linings made of a polymer material.

9. The reticle compartment according to claim 1, wherein all outermost peripheral openings are smaller in their individual opening area than openings in the central section.

10. The reticle compartment according to claim 1, wherein the individual openings comprise opening areas which are round and/or oval and/or square and/or triangular and/or oblong and/or egg shaped and/or crescent shaped and/or slit shaped and/or polygon shaped.

11. A diffusor plate adapted to be used in a reticle compartment according to claim 1.

12. A diffusor plate adapted to be used in an interior of a reticle compartment between an inlet port of the reticle compartment and a reticle storage portion of the reticle compartment and/or between the reticle storage portion of the reticle compartment and an outlet port of the reticle compartment, provided with openings, openings in a central section of the diffusor plate being provided with a larger individual opening area and/or providing a larger total opening area per unit area than openings in a peripheral section of the diffusor plate, wherein the peripheral section circumscribes the central section.

* * * * *